United States Patent
Bode et al.

(12) 
(10) Patent No.: US 6,576,385 B2
(45) Date of Patent: Jun. 10, 2003

(54) METHOD OF VARYING STEPPER EXPOSURE DOSE TO COMPENSATE FOR ACROSS-WAFER VARIATIONS IN PHOTORESIST THICKNESS

(75) Inventors: Christopher A. Bode, Austin, TX (US); Joyce S. Oey Hewett, Austin, TX (US); Alexander J. Pasadyn, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 19 days.

(21) Appl. No.: 09/776,206

(22) Filed: Feb. 2, 2001

(65) Prior Publication Data

US 2002/0106821 A1 Aug. 8, 2002

(51) Int. Cl.⁷ .............................. G03F 9/00; G03C 5/00
(52) U.S. Cl. .......................................... 430/30; 430/312
(58) Field of Search ................................... 430/30, 312

(56) References Cited

U.S. PATENT DOCUMENTS

| | | | |
|---|---|---|---|
| 4,500,615 A | 2/1985 | Iwai | 430/30 |
| 5,526,093 A | 6/1996 | Takahashi | 355/53 |
| 5,916,717 A * | 6/1999 | Yang et al. | 430/30 |
| 6,259,521 B1 * | 7/2001 | Miller et al. | 430/30 |

FOREIGN PATENT DOCUMENTS

| | | | |
|---|---|---|---|
| JP | 60-177623 | 9/1985 | H01L/21/30 |
| JP | 2-25851 | 1/1990 | G03F/7/20 |
| JP | 2-25852 | 1/1990 | G03F/7/20 |

* cited by examiner

Primary Examiner—Christopher G. Young
(74) Attorney, Agent, or Firm—Williams, Morgan & Amerson, P.C.

(57) ABSTRACT

A method of compensating for across-wafer variations in photoresist thickness is provided. The method comprises providing a wafer having a process layer formed thereabove, forming a layer of photoresist above the process layer, measuring a thickness of the layer of photoresist at a plurality of locations to result in a plurality of thickness measurements, providing the thickness measurements to a controller that determines, based upon the thickness measurements, an exposure dose of an exposure process to be performed on the layer of photoresist, and performing the exposure process on the layer of photoresist using the determined exposure dose. This exposure dose may be varied on a flash-by-flash basis as the stepper tool "steps" across the surface of wafers. That is, the exposure dose for a group of flashes, or for each flash, may be varied in response to the thickness measurements.

43 Claims, 3 Drawing Sheets

METHOD OF VARYING STEPPER EXPOSURE DOSE TO COMPENSATE FOR ACROSS-WAFER VARIATIONS IN PHOTORESIST THICKNESS

BACKGROUND OF THE INVENTION

1. Field of the Invention

This invention relates generally to semiconductor fabrication technology, and, more particularly, to an automated method of varying stepper exposure dose to compensate for across-wafer variations in photoresist thickness, and a system for accomplishing same

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1A, may be formed above a surface 15 of a semiconducting substrate or wafer 11, such as doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1A, are formed above a semiconducting substrate. In general, semiconductor manufacturing operations involve, among other things, the formation of layers of various materials, e.g., polysilicon, insulating materials, etc., and the selective removal of portions of those layers by performing known photolithographic and etching techniques. These processes are continued until such time as the integrated circuit device is complete. Additionally, although not depicted in FIG. 1A, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible, due to the reduced size of those features in such modern devices. For example, gate electrodes may now be patterned to a width 12 that is approximately 0.2 $\mu$m (2000 Å), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Thus, there is a great desire for a method that may be used to accurately, reliably and repeatedly form features to their desired critical dimension, i.e., to form the gate electrode 14 to its desired critical dimension 12.

In modern semiconductor fabrication facilities, photolithography is a process typically employed in semiconductor manufacturing. Photolithography generally involves forming a patterned layer of photoresist above a layer of material that is desired to be patterned and using the patterned photoresist layer as a mask. In general, in photolithography operations, the pattern desired to be formed on the underlying layer of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

However, for a variety of reasons, the thickness of the layer of photoresist may not be uniform across the surface of the wafer, i.e., the thickness of the layer of photoresist may be greater than or less than the desired target thickness of the photoresist. Such variations may occur for a number of reasons. For example, there may be variations in the topology of one or more of the underlying films or process layers, the spinning process used to apply the photoresist to the wafer may be performed for too long or too short of a duration resulting in a layer of photoresist that is too thick or too thin. Additionally, there may be variations in the pre-bake process (sometimes referred to as soft-bake) prior to exposure in which various regions or sections of the wafer may be subjected to different temperatures, thereby, in a relative sense, locally driving off more solvents from the layer of photoresist thereby resulting in thickness variations. Of course, there may be other causes for across-wafer variations in photoresist thickness.

Moreover, such variations may be highly localized, or they may exhibit a recognizable pattern. For example, if one or more of the underlying process layers exhibits a large topographical discontinuity, e.g., a larger peak or valley, then the photoresist layer may be thinned or thickened, respectively, in the localized area of the discontinuity. Alternatively, it may be the case that the layer of photoresist is thinner in a central region of the wafer and thicker in outer regions of the wafer, or vice-versa. Thus, a variety of spatial variations in the photoresist thickness may be observed, including various recognizable patterns of thickness variations.

There is a relatively complex relationship between the thickness of the layer of photoresist, the exposure dose and the resulting DICD of the features formed in the layer of photoresist. The relationship of resist thickness to the DICD of features formed in the layer of photoresist can be explained by reference to FIG. 1B, a so-called "swing curve." The swing curve depicted in FIG. 1B is representative of modern I-line and deep ultraviolet (DUV) processes. Due to thin film interference effects, constructive or destructive interferences will either amplify or diminish the delivered exposure energy. In effect, this create a sinusoidal relationship between the DICD of photoresist features and the thickness of the layer of photoresist, as shown in FIG. 1B. Typically, a target resist thickness is selected such that the process is operating at a peak 19 or valley 21 on the swing curve 17. When operating at these points, small changes (plus or minus) in the thickness of the layer of photoresist do not produce as large a change in DICD measurements, as compared to other points, e.g., point 37. That is, when operating at a peak 19 or a valley 21, the process tends to be more stable. Thus, variations in the thickness of the layer of photoresist may adversely impact the ability to produce photoresist features at the targeted DICD values.

Such variations are problematic in modern semiconductor manufacturing operations. For example, all other things being equal, for a constant exposure dose, if the process is designed to operate at point 19 of the swing curve, small changes in resist thickness (plus or minus) will result in the DICD measurements being smaller than anticipated. In another example, if the process is designed to operate at point 21 of the swing curve 22, changes in resist thickness will cause an increase in the DICD of the photoresist features.

Such across-wafer variations in photoresist thickness may lead to unacceptable. variations in the performance of devices fabricated in different locations on the wafer. For example, the critical dimension 12 of the gate electrode 14 may be greater or less than anticipated. As a result, there may be devices with greater than desired channel lengths and, accordingly, slower operating speeds. The channel lengths could also be smaller than anticipated, thereby resulting in devices with increased leakage currents and power consumption.

The present invention is directed to a method and system that solves, or reduces, some or all of the aforementioned problems.

SUMMARY OF THE INVENTION

The present invention is directed to a method of varying stepper exposure dose to compensate for across-wafer variations in photoresist thickness, and system for accomplishing same. In one illustrative embodiment, the method comprises providing a wafer having a process layer formed thereabove and forming a layer of photoresist above the process layer. The method further comprises measuring a thickness of the layer of photoresist at a plurality of locations to result in a plurality of thickness measurements, providing the thickness measurements to a controller that determines, based upon the thickness measurements, an exposure process to be performed on the layer of photoresist, the exposure process comprised of across-wafer variations in exposure dose, and performing the exposure process comprised of the across-wafer variations in exposure dose on the layer of photoresist. This exposure dose may be varied on a flash-by-flash basis as the stepper tool "steps" across the surface of wafers. That is, the exposure dose for a group of flashes, or for each flash, may be varied in response to the thickness measurements.

In another illustrative embodiment, a method comprises providing a plurality of wafers, each having a process layer formed thereabove, and forming a layer of photoresist above each of the process layers. The method further comprises measuring a thickness of a plurality of the layers of photoresist at a plurality of locations to result in a plurality of thickness measurements, providing the thickness measurements to a controller that determines, based upon the thickness measurements, an exposure process to be performed on a layer of photoresist formed on a subsequently processed wafer, the exposure process being comprised of across-wafer variations in exposure dose, and performing the exposure process comprised of the across-wafer variations in exposure dose on the layer of photoresist on the subsequently processed wafer.

BRIEF DESCRIPTION OF THE DRAWINGS

The invention may be understood by reference to the following description taken in conjunction with the accompanying drawings, in which like reference numerals identify like elements, and in which.

Figure 1A:
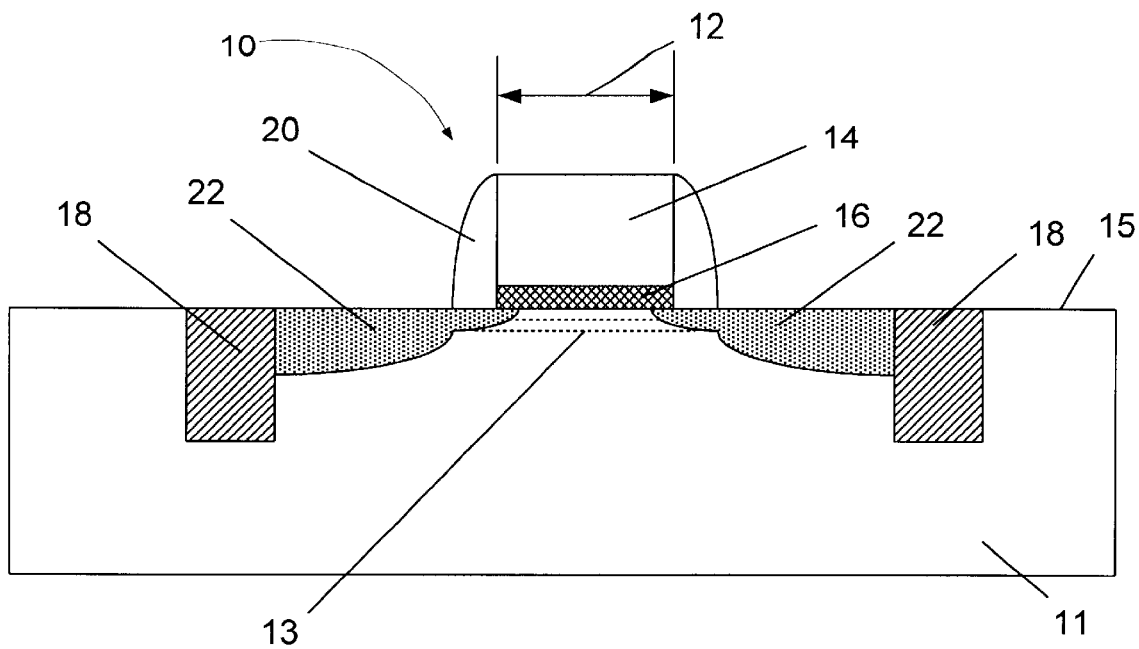
FIG. 1A is a cross-sectional view of an illustrative prior art transistor.
Figure 1B:
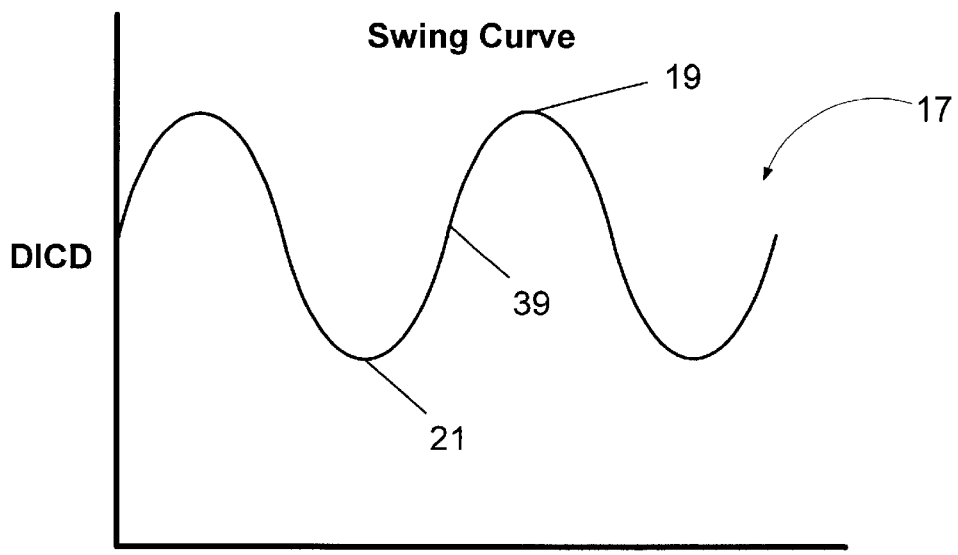
FIG. 1B is an illustrative "swing curve" depicting a relationship between DICD measurements and photoresist thickness.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of varying stepper exposure dose across a surface of a wafer to compensate for across-wafer variations in photoresist thickness, and system for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above a process layer in which a feature, e.g., a metal line, a gate electrode, an opening in a layer of insulating material, will be formed. Thereafter, a pattern that is desired to be transferred into the underlying process layer will be formed in the layer of photoresist material. Then, using one or more etching processes, the underlying process layer is etched using the patterned layer of photoresist as a mask, thereby resulting in a patterned process layer that replicates the pattern formed in the layer of photoresist.

Figure 2:
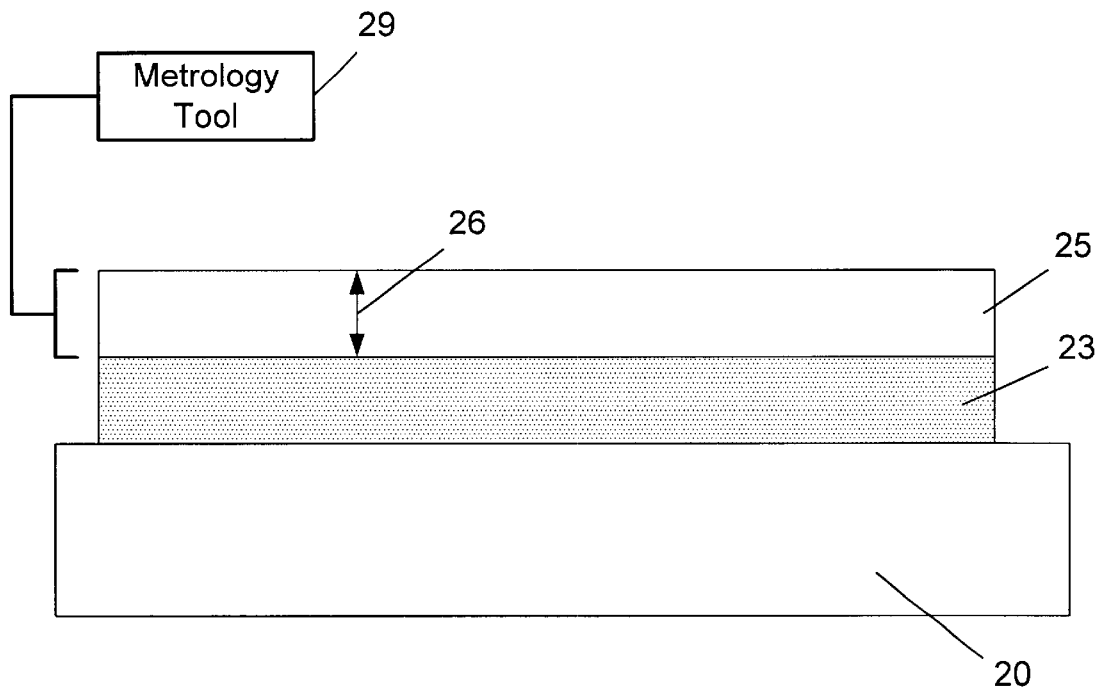
FIG. 2 is a cross-sectional view depicting an illustrative wafer having a layer of photoresist and a process layer formed thereabove.

As shown in FIG. 2, an illustrative process layer 23 is formed above a structure 20, and a layer of photoresist material 25 is formed above the process layer 23. As will be readily apparent to those skilled in the art after reading the present application, the structure 20 may be a semiconducting substrate, e.g., a silicon wafer, or it may represent one or more previously formed layers of material above such a semiconducting substrate, e.g., a stack of insulating layers each having a plurality of conductive interconnections formed therein. Similarly, the process layer 23 may be comprised of any type of material commonly encountered in semiconducting processing, e.g., it may be a layer of polysilicon, a layer of metal, e.g., aluminum, or it may be a layer of insulating material, e.g., a layer of silicon dioxide, HSQ, a layer of material having a dielectric constant greater than 3, etc. Moreover, the process layer 23 may be formed by a variety of techniques, e.g., chemical vapor deposition (CVD), physical vapor deposition (PVD), thermal growth, etc., and the thickness of the process layer 23 may vary greatly. Similarly, the layer of photoresist 25 may be either a positive or negative type photoresist, and it may be formed by a variety of techniques, e.g., a variety of spin-coating techniques commonly employed in modern semiconductor manufacturing.

More particularly, the photolithography process generally involves the steps of: (1) applying a layer of photoresist above a wafer, typically accomplished by a spin-coating process; (2) pre-baking (or soft-baking) the layer of photoresist 25 at a temperature of approximately 90–120° C. to reduce the level of solvents in the layer of photoresist 25 and to the adhesion characteristics of the photoresist, (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5–15° C. higher than the pre-bake process; (5) performing a develop process to turn the latent image in the layer of photoresist into the final resist image; and (6) performing a post-bake process (or hard-bake) at a temperature of approximately 125–160° C. to remove residual solids, improve adhesion, and to increase the etch resistance of the photoresist. These process steps are well known to those skilled in the art and, thus, will not be described herein in any greater detail.

The layer of photoresist 25 in FIG. 2 is depicted at the point in the process after it has been subjected to a pre-bake (soft-bake) process and prior to being exposed to a light source in a stepper tool. At this point, one or more metrology tools 29 are used to measure or determine the thickness 26 of the layer of photoresist 25 at a plurality of locations across the surface of the structure 20. A variety of metrology tools may be used for this purpose. For example, the metrology tool 29 may be an ellipsometer, or any other tool useful for measuring the thickness 26 of the layer of photoresist 25.

Moreover, the number and location of thickness measurements taken of the layer of photoresist 25 may be varied as a matter of design choice. In general, in a pattern measurements should be taken such that across-wafer thickness variations may be detected. For example, measurements taken along several lines that correspond to the diameter of a wafer may be used. The more measurements taken, the higher degree of likelihood that the measurements actually reflect the true thickness of the layer of photoresist 25 at various locations across the wafer. However, the responsible process engineer will have to decide on an appropriate number of measurements to be taken, as well as the location of those measurements consistent with the degree of confidence desired by the process engineer with respect to the particular application under consideration. In one illustrative embodiment, for an 8-inch diameter wafer, approximately 45 measurements may be taken of the layer of photoresist 25 in a star or checkerboard type pattern.

Figure 3:
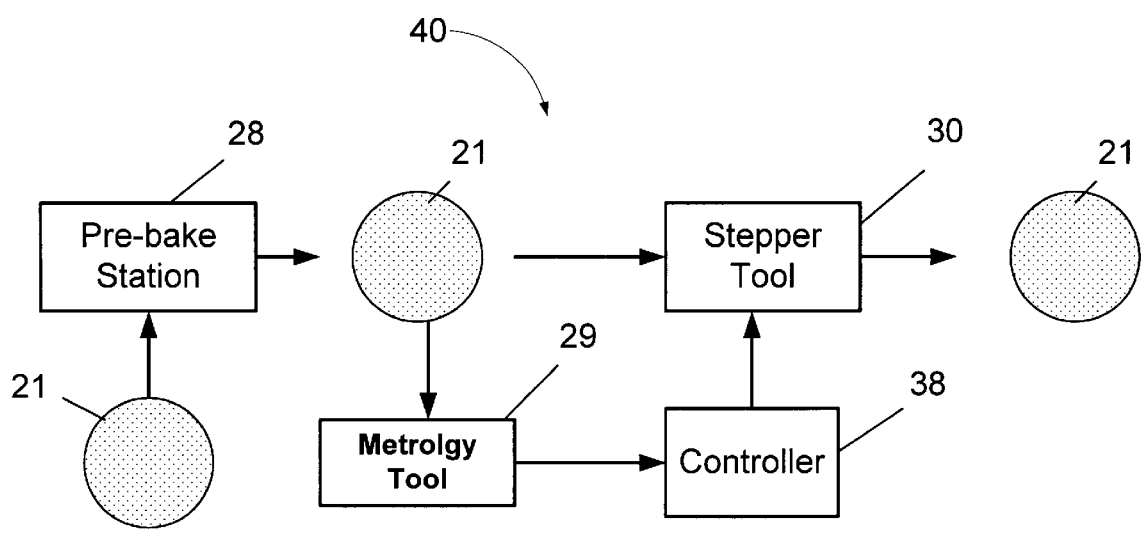
FIG. 3 depicts an illustrative embodiment of a system in accordance with one embodiment of the present invention.

An illustrative system 40 that may be used in one embodiment of the present invention is shown in FIG. 3. The system 40 is comprised of a pre-bake process station 28, a stepper tool 30, an illustrative metrology tool 29, and a controller 38. As indicated in FIG. 3, one or more wafers 21, having a layer of photoresist (not shown) formed above an underlying process layer (not shown) are provided to the pre-bake process station 28 whereby they are subjected to a traditional pre-bake process. The pre-bake station 28 and stepper tool 30 are normally parts of a photolithography module formed in modern semiconductor manufacturing facilities.

Thereafter, using one or more of the metrology tools 29, multiple measurements are made of the thickness 26 of the layer of photoresist 25 at various locations across the surface of the wafer 21. This measurement data is provided to the controller 38. The measurement data provided to the controller 38 may be averaged or otherwise statistically manipulated in the controller 38. The controller 38 then determines, based upon the measurement data obtained by the metrology tool 29, the exposure dose of the exposure process to be performed on the measured wafer 21 (or on additional wafers) in the stepper tool 30, whereby an image on a reticle will be projected onto the layer of photoresist 25.

Figure 4:
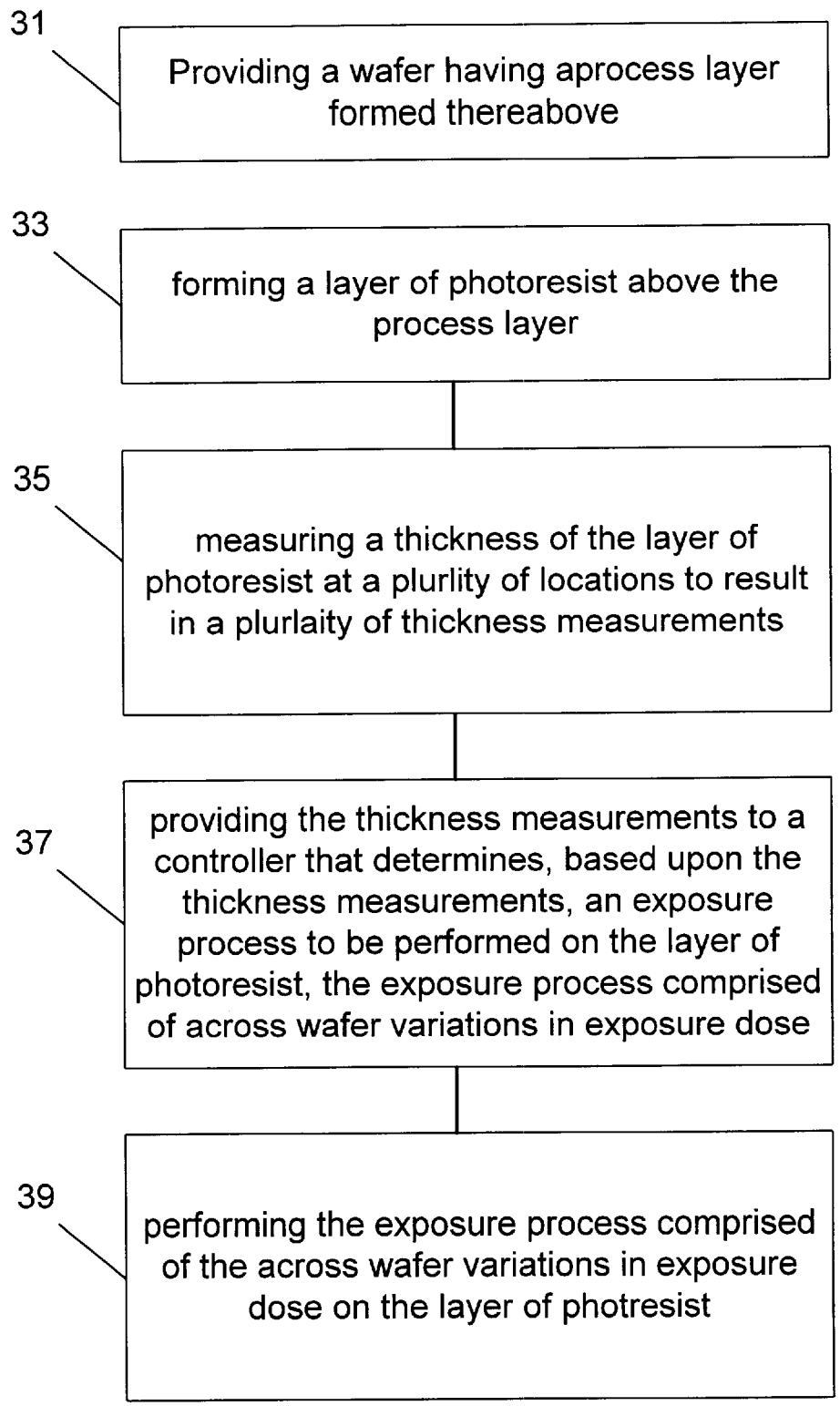
FIG. 4 is a flowchart depicting one illustrative embodiment of the present invention.

In one illustrative embodiment, as indicated in FIG. 4, the method described herein comprises providing the wafer 21 having the process layer 23 formed thereabove, as indicated at block 31, and forming a layer of photoresist 25 above the process layer 23, as indicated at block 33. The method further comprises measuring the thickness 26 of the layer of photoresist 25 at a plurality of locations to result in a plurality of thickness measurements, as indicated at block 35, and providing the thickness measurements to the controller 38 that determines, based upon the thickness measurements, an exposure process to be performed on the layer of photoresist 25, the exposure process comprised of across-wafer variations in exposure dose, as recited in block 37. The method concludes with performing the exposure process comprised of the across-wafer variations in exposure dose on the layer of photoresist 25, as set forth in block 39. Using the present invention, the exposure dose may be varied on a flash-by-flash basis as the stepper tool "steps" across the surface of wafers. That is, the exposure dose for a group of flashes, or for each flash, may be varied across the surface of the wafer in response to the thickness measurements.

By way of example only, consider the situations where the features to be formed in the underlying process layer 23 are line-type features, e.g., conductive metal lines, gate electrodes, etc. Assuming the operations at the peak 19 of the swing curve 17, if the measurements indicate that a positive layer of photoresist 25 has been formed with a thickness greater or less than desired (either locally or in a given region), then the controller 38, based upon these thickness measurements, may increase the exposure dose (either locally or in a given region) on the measured wafer 21 and/or on subsequently processed wafers to drive the DICD dimensions to the targeted value at peak 19. That is, the exposure dose may be varied to compensate for resist thickness changes to thereby produce devices wherein the critical dimension of fabricated line-type features is within acceptable limits. In one illustrative embodiment, this process would start with a measurement of the thickness of the layer of photoresist 25, and, based upon that measured thickness, an estimate of DICD dimensions may be made on the assumption that a nominal or standard exposure dose is to be performed on the layer of photoresist 25. Based upon this information, the exposure dose performed by a stepper tool may be adjusted, i.e., increased or decreased, to compensate for the anticipated variation in the DICD measurements.

In the case of forming openings in process layers, the adjustment of the exposure dose is opposite to the adjustment of the exposure dose for line-type features. That is, if the thickness of the positive layer of photoresist 25 is greater or less than desired (assuming operation at peak 19), the controller 38 may reduce the exposure dose on subsequently processed wafers, thereby reducing the critical dimension of the openings.

The thickness measurements of the layer of photoresist 25 may be performed on any desired number of wafers. For example, such measurements may be performed on all wafers in one or more lots, or on a representative number of wafers in a given lot, and these results may then be used to vary the exposure dose of the exposure process performed in the stepper tool 30 on the measured wafers or on subsequently processed wafers. Additionally, more than one lot of wafers may be analyzed until such time as the process engineer has achieved a sufficiently high degree of confidence that the metrology accurately reflects the thickness of the layers of photoresist produced by a particular recipe in a particular photolithography module.

In another illustrative embodiment, the method disclosed herein comprises providing a plurality of wafers, each having a process layer formed thereabove, and forming a layer of photoresist above each of the process layers. The method further comprises measuring a thickness of a plurality of the layers of photoresist at a plurality of locations to result in a plurality of thickness measurements, and providing the thickness measurements to a controller that determines, based upon the thickness measurements, an exposure process to be performed on a layer of photoresist formed on a subsequently processed wafer, the exposure process being comprised of across-wafer variations in exposure dose, and performing the exposure process comprised of the across-wafer variations in exposure dose on the layer of photoresist on the subsequently processed wafer.

In the illustrated embodiment, the controller 38 is a computer programmed with software to implement the functions described herein. Moreover, the functions described for the controller 38 may be performed by one or more controllers spread through the system. For example, the controller 38 may be a fab level controller that is used to control processing operations throughout all or a portion of a semiconductor manufacturing facility. Alternatively, the controller 38 may be a lower level computer that controls only portions or cells of the manufacturing facility. Moreover, the controller 38 may be a stand-alone device, or it may reside on the tool 30 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or. similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 38, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI.

Through use of the present invention, semiconductor processing operations and yields may be increased. By using the present invention, whereby variations in exposure dose are determined based upon variations in the thickness of a layer of photoresist, devices with more uniform operational and structural characteristics may be formed across the surface of a wafer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming features in a layer of photoresist, comprising:

providing a wafer having a process layer formed thereabove;

forming the layer of photoresist above said process layer;

determining a target value of a critical dimension of the features;

measuring a thickness of said layer of photoresist at a plurality of locations to result in a plurality of thickness measurements;

providing said thickness measurements and said target value to a controller that determines, based upon said thickness measurements and said target value, an exposure process to be performed on said layer of photoresist, said exposure process comprised of across-wafer variations in exposure dose; and performing said exposure process comprised of said across-wafer variations in exposure dose on said layer of photoresist.

2. The method of claim 1, wherein said wafer is comprised of silicon.

3. The method of claim 1, wherein providing a wafer having a process layer formed thereabove comprises providing a wafer having a process layer comprised of at least one of polysilicon, a metal, and a layer of material having a dielectric constant greater than 3 formed thereabove.

4. The method of claim 1, wherein forming a layer of photoresist above said process layer comprises forming a layer of positive photoresist above said process layer.

5. The method of claim 1, wherein forming a layer of photoresist above said process layer comprises forming a layer of negative photoresist above said process layer.

6. The method of claim 1, wherein measuring a thickness of said layer of photoresist is performed using an ellipsometer.

7. The method of claim 1, wherein said controller is resident on a stepper tool.

8. The method of claim 1, wherein said controller is a stand-alone computer.

9. The method of claim 1, wherein forming a layer of photoresist above said process layer comprises forming a layer of photoresist above said process layer by a spin-coating process.

10. The method of claim 1, wherein measuring a thickness of said layer of photoresist is performed after said layer of photoresist is heated to a temperature range from approximately 80–100° C. and prior to subjecting said layer of photoresist to an exposure process in a stepper tool.

11. A method of forming features in a layer of photoresist, comprising:

providing a wafer comprised of silicon, said wafer having a process layer formed thereabove;

forming the layer of photoresist above said process layer;

determining a target value of a develop inspect critical dimension of the features;

measuring a thickness of said layer of photoresist at a plurality of locations to result in a plurality of thickness measurements, said measurements of said layer of photoresist being performed after said layer of photoresist is heated to a temperature that ranges from approximately 80–100° C. and prior to subjecting said layer of photoresist to an exposure process in a stepper tool;

providing said thickness measurements and said target value to a controller that determines, based upon said thickness measurements ans daid target value, an exposure process to be performed on said layer of photoresist, said exposure process comprised of across-wafer variations in exposure dose; and performing said exposure process comprised of said across-wafer variations in exposure dose on said layer of photoresist.

12. The method of claim 11, wherein providing a wafer comprised of silicon, said wafer having a process layer formed thereabove, comprises providing a wafer comprised of silicon, said wafer having a process layer comprised of at least one of polysilicon, a metal, and a layer of material having a dielectric constant greater than 3 formed thereabove.

13. The method of claim 11, wherein forming a layer of photoresist above said process layer comprises forming a layer of positive photoresist above said process layer.

14. The method of claim 11, wherein forming a layer of photoresist above said process layer comprises forming a layer of negative photoresist above said process layer.

15. The method of claim 11, wherein measuring a thickness of said layer of photoresist is performed using an ellipsometer.

16. The method of claim 11, wherein said controller is resident on a stepper tool.

17. The method of claim 11, wherein said controller is a stand-alone computer.

18. The method of claim 11, wherein forming a layer of photoresist above said process layer comprises forming a layer of photoresist above said process layer by a spin-coating process.

19. A method of forming features in layers of photoresist, comprising:
- providing a plurality of wafers, each having a process layer formed thereabove;
- forming a layer of photoresist above each of said process layers;
- determining a target value of a critical dimension of the features to be formed in said layers of photoresist;
- measuring a thickness of a plurality of the layers of photoresist at a plurality of locations to result in a plurality of thickness measurements;
- providing said thickness measurements and said target value to a controller that determines, based upon said thickness measurements and said target value, an exposure process to be performed on a layer of photoresist formed on a subsequently processed wafer, said exposure process comprised of across-wafer variations in exposure dose; and
- performing said exposure process comprised of said across-wafer variations in exposure dose on said layer of photoresist formed on said subsequently processed wafer.

20. The method of claim 19, wherein said wafer is comprised of silicon.

21. The method of claim 19, wherein providing a plurality of wafers each having a process layer formed thereabove comprises providing a plurality of wafers each having a process layer comprised of at least one of polysilicon, a metal, and a layer of material having a dielectric constant greater than 3 formed thereabove.

22. The method of claim 19, wherein forming a layer of photoresist above each of said process layers comprises forming a layer of positive photoresist above each of said process layers.

23. The method of claim 19, wherein forming a layer of photoresist above each of said process layers comprises forming a layer of negative photoresist above each of said process layers.

24. The method of claim 19, wherein measuring a thickness of a plurality of layers of photoresist is performed using an ellipsometer.

25. The method of claim 19, wherein said controller is resident on a stepper tool.

26. The method of claim 19, wherein said controller is a stand-alone computer.

27. The method of claim 19, wherein forming a layer of photoresist above each of said process layers comprises forming a layer of photoresist above each of said process layers by a spin-coating process.

28. The method of claim 19, wherein measuring a thickness of a plurality of layers of photoresist is performed after said layers of photoresist are heated to a temperature that ranges from approximately 80–100° C. and prior to subjecting said layers of photoresist to an exposure process in a stepper tool.

29. A method of forming features in layers of photoresist, comprising:
- providing a plurality of wafers comprised of silicon, each of said wafers having a process layer formed thereabove;
- forming a layer of photoresist above each of said process layers;
- determining a target value of a critical dimension of the features to be formed in said layers of photoresist;
- measuring a thickness of a plurality of the layers of photoresist at a plurality of locations to result in a plurality of thickness measurements, said measurements of said plurality of layers of photoresist being performed after said layers of photoresist are heated to a temperature that ranges from approximately 80–100° C. and prior to subjecting said layers of photoresist to an exposure process in a stepper tool;
- providing said thickness measurements and said target value to a controller that determines, based upon said thickness measurements and said target value, an exposure process to be performed on a layer of photoresist formed on a subsequently processed wafer, said exposure process comprised of across-wafer variations in exposure dose; and
- performing said exposure process comprised of said across-wafer variations in exposure dose on said layer of photoresist formed on said subsequently processed wafer.

30. The method of claim 29, wherein providing a plurality of wafers comprised if silicon, each of said wafers having a process layer formed thereabove, comprises providing a plurality of wafers comprised of silicon, each of said wafers having a process layer comprised of at least one of polysilicon, a metal, and a layer of material having a dielectric constant greater than 3 formed thereabove.

31. The method of claim 29, wherein forming a layer of photoresist above each of said process layers comprises forming a layer of positive photoresist above each of said process layers.

32. The method of claim 29, wherein forming a layer of photoresist above each of said process layers comprises forming a layer of negative photoresist above each of said process layers.

33. The method of claim 29, wherein measuring a thickness of a plurality of layers of photoresist is performed using an ellipsometer.

34. The method of claim 29, wherein said controller is resident on a stepper tool.

35. The method of claim 29, wherein said controller is a stand-alone computer.

36. The method of claim 29, wherein forming a layer of photoresist above each of said process layers comprises forming a layer of photoresist above each of said process layers by a spin-coating process.

37. A method of forming features in a layer of photoresist, comprising:
- determining a target value of a critical dimension of the features;
- measuring a thickness of the layer of photoresist on a wafer at a plurality of locations to result in a plurality of thickness measurements;
- providing said thickness measurements and said target value to a controller that determines, based upon said thickness measurements and said target value, an exposure process to be performed on said layer of photoresist, said exposure process comprised of across-wafer variations in exposure dose; and
- performing said exposure process comprised of said across-wafer variations in exposure dose on said layer of photoresist.

38. The method of claim 37, wherein said wafer is comprised of silicon.

39. The method of claim 37, wherein said layer of photoresist is comprised of at least one of a positive photoresist and a negative photoresist.

40. The method of claim 37, wherein measuring a thickness of said layer of photoresist is performed using an ellipsometer.

41. The method of claim 37, wherein said controller is resident on a stepper tool.

42. The method of claim 37, wherein said controller is a stand-alone computer.

43. The method of claim 37, wherein measuring a thickness of said layer of photoresist is performed after said layer of photoresist is heated to a temperature range from approximately 80–100° C. and prior to subjecting said layer of photoresist to an exposure process in a stepper tool.

* * * * *